(12) United States Patent
Matsuda et al.

(10) Patent No.: US 6,525,629 B2
(45) Date of Patent: Feb. 25, 2003

(54) SURFACE ACOUSTIC WAVE FILTER

(75) Inventors: Takashi Matsuda, Kawasaki (JP); Jun Tsutsumi, Kawasaki (JP); Osamu Ikata, Kawasaki (JP); Yoshio Satoh, Kawasaki (JP)

(73) Assignees: Fujitsu Limited, Kawasaki (JP); Fujitsu Media Devices Limited, Suzaka (JP)

( * ) Notice: Subject to any disclaimer, the term of this patent is extended or adjusted under 35 U.S.C. 154(b) by 0 days.

(21) Appl. No.: 09/725,140

(22) Filed: Nov. 29, 2000

(65) Prior Publication Data

US 2001/0040489 A1 Nov. 15, 2001

(30) Foreign Application Priority Data

Jan. 5, 2000 (JP) ........................................ 2000-005280

(51) Int. Cl.[7] ................................................ H03H 9/64
(52) U.S. Cl. ........................ 333/195; 333/193; 333/196
(58) Field of Search ................................ 333/193, 195, 333/133; 310/313 B, 313 R

(56) References Cited

U.S. PATENT DOCUMENTS

| | | | | |
|---|---|---|---|---|
| 3,550,045 A | * | 12/1970 | Adler | 333/193 |
| 4,081,769 A | * | 3/1978 | Shreve | 333/195 |
| 4,609,891 A | * | 9/1986 | Solie et al. | 333/195 |
| 5,426,339 A | * | 6/1995 | Wright | 310/313 D |
| 5,471,499 A | * | 11/1995 | Brown et al. | 375/305 |
| 5,475,348 A | * | 12/1995 | Hode et al. | 333/195 |
| 5,485,052 A | * | 1/1996 | Seki et al. | 310/313 B |
| 5,646,584 A | * | 7/1997 | Kondratyev et al. | 333/193 |
| 5,661,444 A | * | 8/1997 | Dill et al. | 333/195 |
| 5,663,696 A | * | 9/1997 | Morgan | 333/194 |

* cited by examiner

Primary Examiner—Robert Pascal
Assistant Examiner—Dean Takaoka
(74) Attorney, Agent, or Firm—Armstrong, Westerman & Hattori, LLP

(57) ABSTRACT

A surface acoustic wave filter including a piezoelectric substrate, an exciting electrode formed on the piezoelectric substrate and exciting a surface acoustic wave, and a receiving electrode receiving the surface acoustic wave. Both the exciting and receiving electrodes are provided with interdigital electrode fingers having a period p. One of the exciting and receiving electrodes is constructed of a plurality of interdigital electrode sub-units having substantially the same electrode surface areas occupied by interdigital electrode fingers. The interdigital electrode sub-units are disposed in a direction perpendicular to a propagation direction of the excited surface acoustic wave and have a positional relation such that the interdigital electrode sub-units are offset from each other by $(n \pm \frac{1}{4})p$, wherein n is an integer, in a direction parallel to the propagation direction of the surface acoustic wave.

5 Claims, 10 Drawing Sheets

FIG. 3 (a)   Prior Art
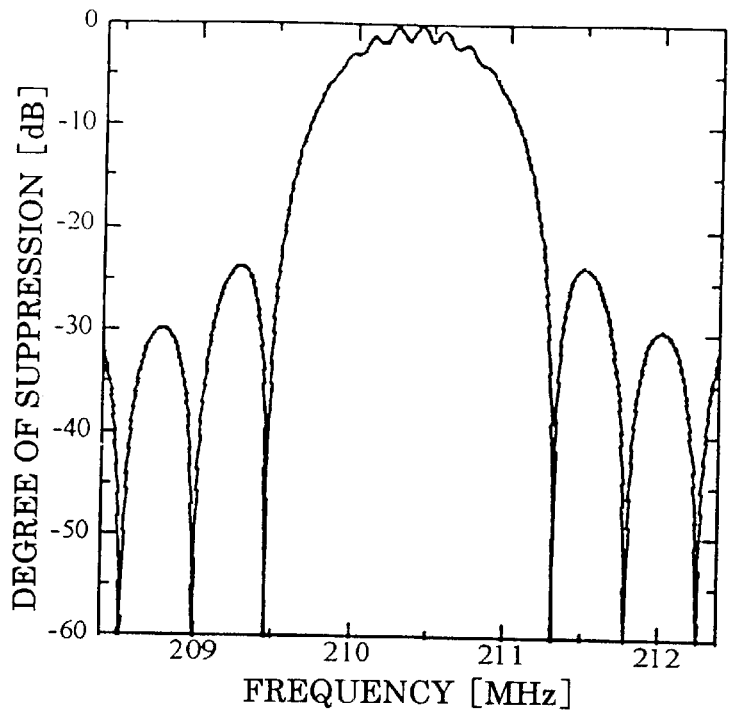
FREQUENCY CHARACTERISTIC
FIG. 3 (b)   Prior Art
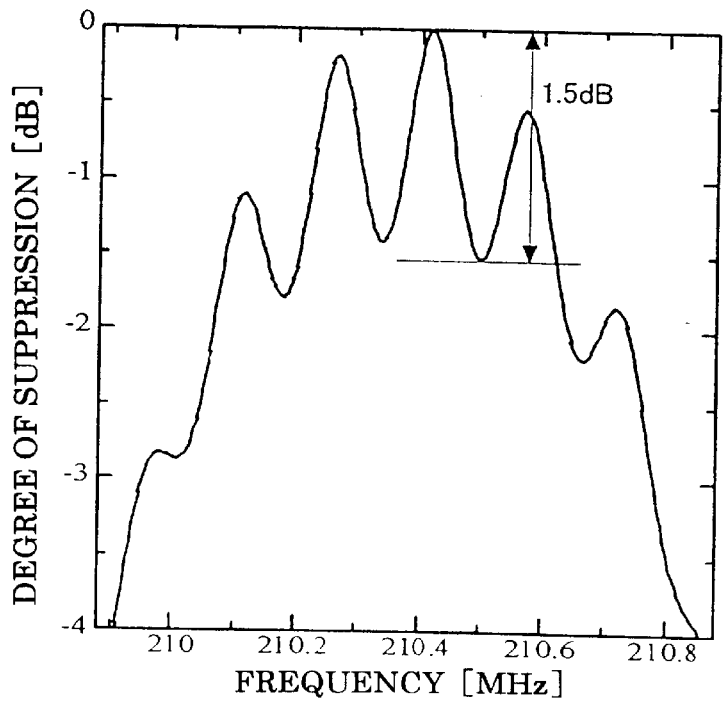
ENLARGEMENT OF THE VICINITY OF THE BAND

SURFACE ACOUSTIC WAVE FILTER

CROSS-REFERENCE TO RELATED APPLICATION

This application is related to Japanese Patent Application No. 2000-5280 filed on Jan. 5, 2000, whose priority is claimed under 35 USC §119, the disclosure of which is incorporated by reference in its entirety.

BACKGROUND OF THE INVENTION

1. Field of the Invention

The present invention relates to a surface acoustic wave filter. Filters utilizing a surface acoustic wave (referred to as SAW hereinafter) exhibit sharp filter characteristics and allow size reduction. Accordingly, they are now used for communication equipment such as portable phones and the like.

2. Description of the Related Art

Various designing techniques are known for SAW filters.

A construction of a transversal SAW filter is shown in FIG. 11. This transversal SAW filter is comprised of an exciting electrode 102 and a receiving electrode 103 which have a plurality of interdigital electrode fingers formed in a comb-like form with a period p on a piezoelectric substrate 101. Both the electrodes are typically formed of an aluminum alloy which usually has a low resistance and a small specific gravity. When an AC voltage 104 is applied to the exciting electrode 102, an electric field is generated and a distortion corresponding to the period p of the electrode fingers is generated on the piezoelectric substrate. This distortion is received as a SAW by the receiving electrode 103.

The central frequency f0 of the SAW excited by the exciting electrode 102 has the following relation with the period p and a velocity V of the SAW which is determined by the type of the piezoelectric substrate:

$$V = f0 \times p.$$

When the interdigital electrode is used as a filter, a band width, a degree of flatness in the band, a degree of suppression, a group delay time and the like are important characteristics. With the transversal SAW filter, these characteristics can be easily controlled by assigning a weight to its electrode. Accordingly, the transversal SAW filter is often used for an intermediate frequency (IF) filter, which permits some loss.

The transversal filter has a problem in that a ripple sometimes occurs in a passband resulting from a tertiary echo.

A generation mechanism of the tertiary echo is shown in FIG. 12. A main response received by a receiving electrode 103 is partially re-excited to the left in the figure by the receiving electrode 103 like reflection. This re-excited wave is further re-excited by an exciting electrode 102 and received by the receiving electrode 103 with a time delay. This phenomenon is the tertiary echo.

Here, re-excitation is referred to simply as "reflection." The tertiary echo is also referred to as triple transit echo (TTE). Because the reflection repeats again and again, the intensity of the tertiary echo is small as compared with the main response but it produces a ripple in the band in a frequency characteristic. Thus, the tertiary echo has been a cause of deterioration of the filter frequency characteristic.

SUMMARY OF THE INVENTION

The present invention provides a surface acoustic wave filter including a piezoelectric substrate; an exciting electrode formed on the piezoelectric substrate and exciting a surface acoustic wave; and a receiving electrode receiving the surface acoustic wave. Both the exciting and receiving electrodes are provided with interdigital electrode fingers having a period p. Either one of the exciting and receiving electrodes is constructed of a plurality of interdigital electrode sub-units having substantially the same electrode surface areas occupied by interdigital electrode fingers. The interdigital electrode sub-units are disposed in a direction perpendicular to a propagation direction of the excited surface acoustic wave and have a positional relation such that the interdigital electrode sub-units are offset from each other by (n±¼)p, wherein n is an integer, in a direction parallel to the propagation direction of the surface acoustic wave.

A SAW filter of the present invention can suppress the ripple caused by the TTE.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 3(a) and 3(b) are graphs showing a frequency characteristic of a prior-art SAW filter;

DESCRIPTION OF THE PREFERRED EMBODIMENTS

In the present invention, the plurality of interdigital electrode sub-units may be formed as separate electrodes.

The plurality of interdigital electrode sub-units may be formed in a single interdigital electrode in which ends of the electrode fingers of the interdigital electrode sub-units are connected to each other by connection electrode fingers.

The electrode of the exciting and receiving electrodes other than that constructed of the plurality of interdigital electrode sub-units may be constructed as a single electrode. Also, the electrode of the exciting and receiving electrodes other than that constructed of the plurality of interdigital electrode sub-units may be constructed of the same number of electrodes as the number of the interdigital electrode sub-units, the electrode being arranged in a direction perpendicular to the propagation direction of the surface acoustic wave.

In the present invention, a known piezoelectric substrate may be used as the piezoelectric substrate. For example, usable are an AT cut quartz, Langasite, Langanite, LBO, $Li_2B_4O_7$ and the like, which have a small temperature coefficient. Metal thin film materials of Cu, Al, Au, Pt and the like can be used for the exciting and receiving electrodes.

As both the exciting and receiving electrodes, what we call interdigital electrodes are used which have a plurality of interdigital electrode fingers in a comb-like form. The electrodes may be interdigital electrodes (single electrodes) having the electrode fingers arranged alternately one be one or interdigital electrodes (double electrodes) having the electrode fingers arranged alternately two by two. Further, the electrode may be thinned down or apodized.

Figure 10:
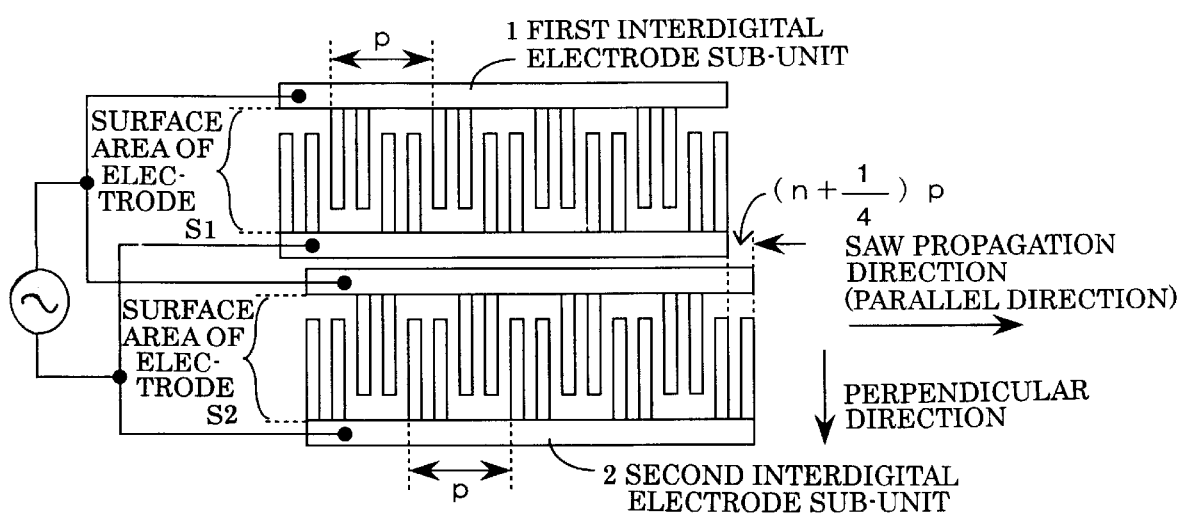
FIG. 10 illustrates an arrangement of interdigital electrode sub-units in accordance with the present invention.
Figure 11:
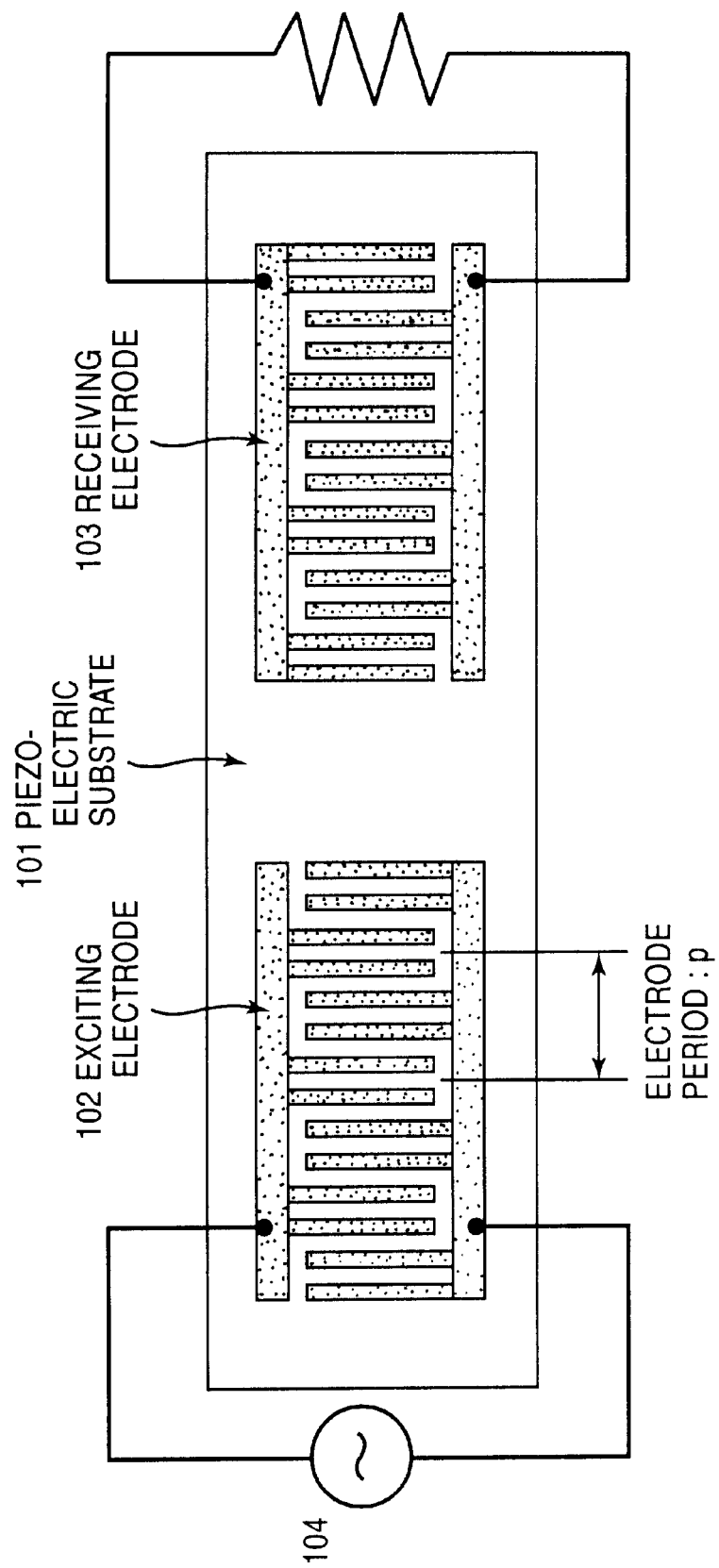
FIG. 11 illustrates the construction of a prior-art transversal SAW filter.
Figure 12:
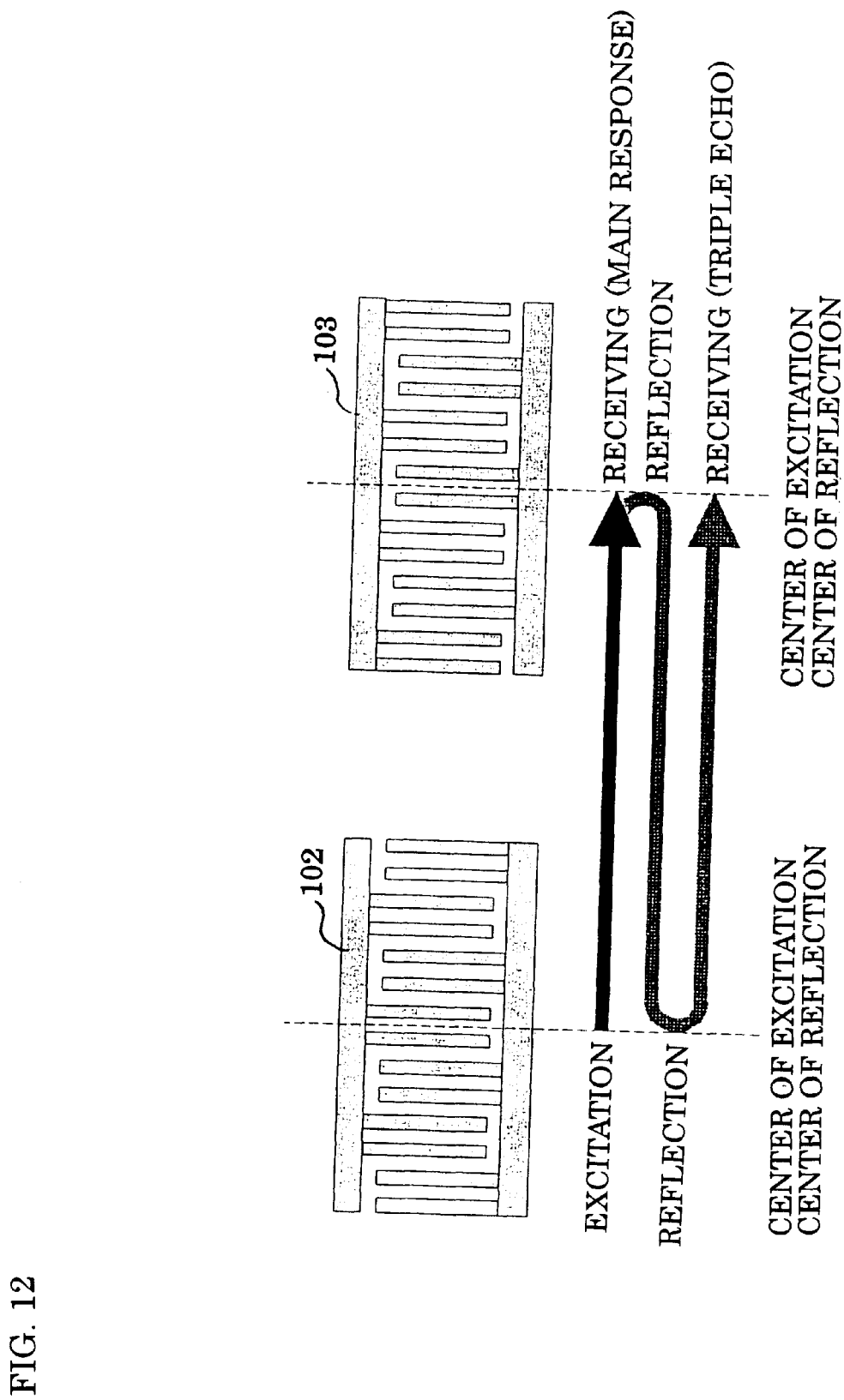
FIG. 12 is for explaining a mechanism of generation of a tertiary echo in a SAW filter.

FIG. 10 illustrates an arrangement of the interdigital electrode sub-units of the present invention. In the figure, reference numerals 1 and 2 denote a first and a second interdigital electrode sub-unit, respectively. Here, the number of interdigital electrode sub-units is two, but may be three or more. A direction from left to right in the figure is referred to as a positive direction in which the SAW propagates.

The first and second interdigital electrode sub-units 1 and 2 are formed to have substantially the same electrode surface areas S1 and S2 (here the electrode surface area means the surface area of a region occupied by the electrode fingers), as shown in the figure. As shown in the figure, given that the period of the electrode fingers is p, the first and second interdigital electrode sub-units are arranged to be offset in a left-to-right direction by (n+¼)p. The interdigital electrode sub-units of this arrangement may be formed in either one of the exciting electrode or the receiving electrode.

The first and second interdigital electrode sub-units may also be arranged to be offset by (n−¼)p. By thus offsetting the two interdigital electrode sub-units, the tertiary echo can be reduced as explained later.

Now the present invention is described in further detail with reference to embodiments shown in the accompanying drawing. However, these embodiments should not be construed to limit the scope of the invention.

Figure 1:
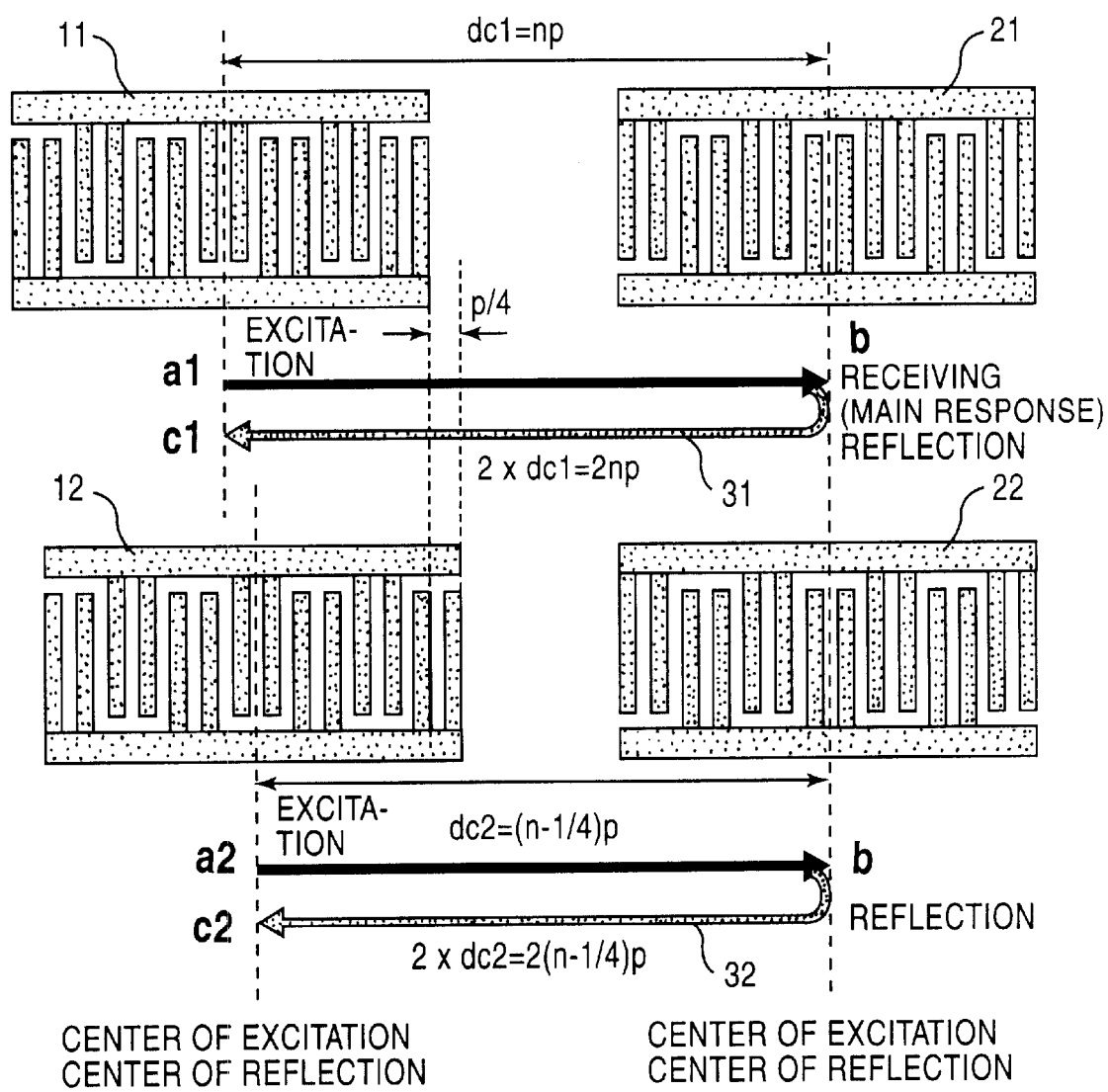
FIG. 1 illustrates the arrangement of electrodes in an example of a SAW filter in accordance with the present invention.

FIG. 1 illustrates the arrangement of electrodes in an example of a SAW filter in accordance with the present invention.

In FIG. 1, a SAW filter is comprised of two exciting electrodes 11, 12 and two receiving electrodes 21, 22.

A pair of the exciting electrode 11 and the receiving electrode 21 is arranged in parallel in the propagation direction of a SAW excited by the exciting electrode 11. Likewise, another pair of the exciting electrode 12 and the receiving electrode 22 is arranged in parallel in the SAW propagation direction. In FIG. 1, the two receiving electrodes 21 and 22 are not offset in the left-to-right direction in the sheet, while the two exciting electrodes 11 and 12 are offset in the left-to-right direction in the sheet by p/4.

In other words, supposing that the distance dc1 between the electrode centers of the exciting electrode 11 and the receiving electrode 21 is an electrode period p multiplied by an integer n (i.e., n×p), the distance dc2 between the electrode centers of the exciting electrode 12 and the receiving electrode 22 is shorter than dc1 by p/4 (i.e., dc2=np−p/4). Here, n is an integer, 0, 1, 2, . . . .

An excited SAW 31 from an excitation center a1 of the exciting electrode 11 is reflected by the reflection center b of the receiving electrode 21 and returns to the exciting electrode 11. At this time, the SAW 31 travels a distance of 2×dc1=2np before it returns to a reflection center c1 (=a1) of the exciting electrode 11.

On the other hand, an excited SAW 32 from an excitation center a2 of the exciting electrode 12 is reflected by the reflection center b of the receiving electrode 22 travels a distance of 2×dc2=2(np−p/4) before it returns to the reflection center c2 (=a2) of the exciting electrode 12. Thus, the above-described two SAWs 31 and 32 are offset to each other by a difference between 2×dc1 and 2×dc2, i.e., p/2, at the reflection centers c1 and c2.

The period p of the electrode fingers corresponds to a phase of 2π. A phase shift of p/2 means a phase shift of π. The above-mentioned SAWs 31 and 32 have a phase shift of π at the reflection centers c1 and c2 and cancel each other out. This means that the reflection caused by re-excitation did not occur.

To sum up, if the positions of the two exciting electrodes are shifted from each other by p/4 in a direction parallel to the SAW propagation direction, the SAWs 31 and 32 cancel each other out at the reflection centers c1 and c2 theoretically, and the tertiary echo TTE is not generated. Also, if this positional shift is np+p/4, the tertiary echo TTE is also not generated.

Now described are examples of SAW filters of the present invention constructed on the basis of this theory.

In general, the distance between the exciting electrode and the receiving electrode indicates a distance dc (distances dc1 and dc2 between the electrode centers in FIG. 1) between the reflection center of the exciting electrode and the reflection center of the receiving electrode. However, in the following examples, a distance d between edges of the electrodes, which is independent of the number of electrode fingers, is regarded as a basic distance. For a horizontal difference (p/4) between the distances d from the edge to the edge of the electrodes corresponds uniquely to a horizontal difference (p/4) between the distances dc from the center to the center of the electrodes.

First, a frequency characteristic of a prior-art SAW filter is shown in FIGS. 3(a) and 3(b) for a comparison purpose. The substrate is made of an AT cut quartz whose temperature coefficient is small. The sound velocity on this substrate is about 3,127 m/s when the electrodes are 300 nm thick. If the electrode period p is 14.8636 μm, a frequency characteristic is obtained whose center frequency is 210.38 MHz, as shown in FIG. 3(a).

Figure 2:
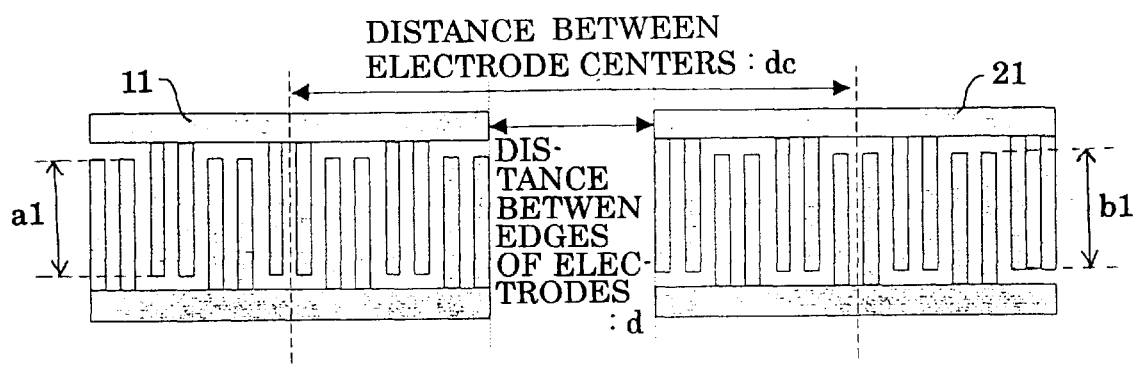
FIG. 2 illustrates an arrangement of an exciting electrode and a receiving electrode in accordance with the present invention.

This is a frequency characteristic in the case where the exciting electrode 11 has 150 pairs of split electrodes and the receiving electrode 21 has 225 pairs of split electrodes. An aperture length a1 (a width of a region where upwardly extending and downwardly extending electrode fingers cross each other; see FIG. 2) of the exciting electrode 11 is 80p, the aperture length b1 of the receiving electrode 21 is 80p, and the distance d between the edges of the electrodes is 20p.

When impedance of the SAW filter is matched, the TTE is emphasized and a ripple appears as shown in FIG. 3(b). FIG. 3(b) is an enlargement of a vicinity of the band of FIG. 3(a). The ripple is 1.5 dB at the maximum, which is considerably large.

EXAMPLE 1

Figure 4:
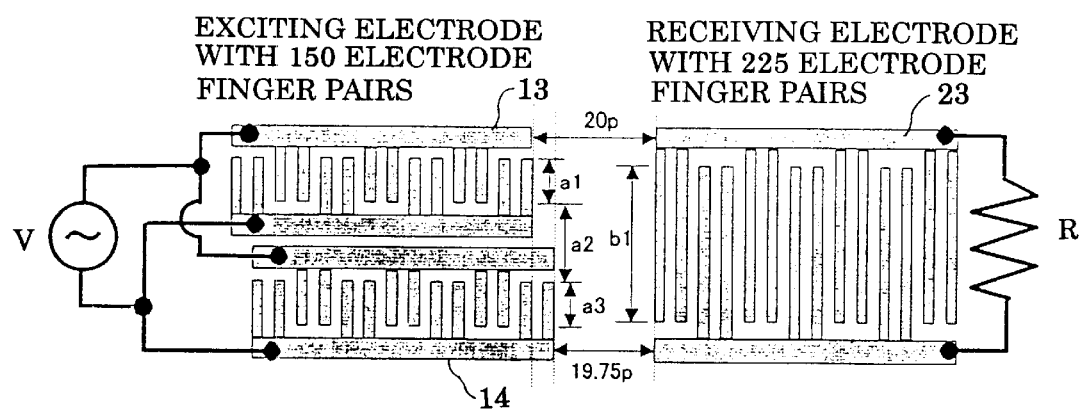
FIG. 4 illustrates the construction of an SAW filter according to Example 1 of the present invention.

FIG. 4 illustrates the construction of an SAW filter according to Example 1 of the present invention. Example 1 shows that the exciting electrode is divided into two exciting electrodes 13 and 14, which are arranged in positions offset from each other by p/4 in the SAW propagation direction. In order to reduce the tertiary echo, the exciting electrodes 13 and 14 preferably have almost the same surface area for regions occupied by their respective interdigital electrodes on the piezoelectric substrate. Bus bar portions positioned on the upper and lower sides of the two exciting electrodes 13 and 14 are connected to an AC electrode V as shown in FIG. 4. On the other hand, bus bar portions of the receiving electrode 23 are connected to a resistance R.

In FIG. 4, the distance between the edges of the exciting electrode 13 and the receiving electrode 23 is 20p, and the distance between the edges of the exciting electrode 14 and the receiving electrode 23 is 19.75p. The difference is p/4 (=0.25p).

The number of electrode finger pairs of each of the exciting electrodes 13 and 14 is 150, the number of electrode finger pairs of the receiving electrode is 225, an upper aperture length a1 of the exciting electrode 13 is 35p, a lower aperture length a3 of the exciting electrode 14 is 35p, a length a2 of a connection part of the two electrodes is 10p, and an aperture length b1 of the receiving electrode 23 is 80p.

Figure 9:
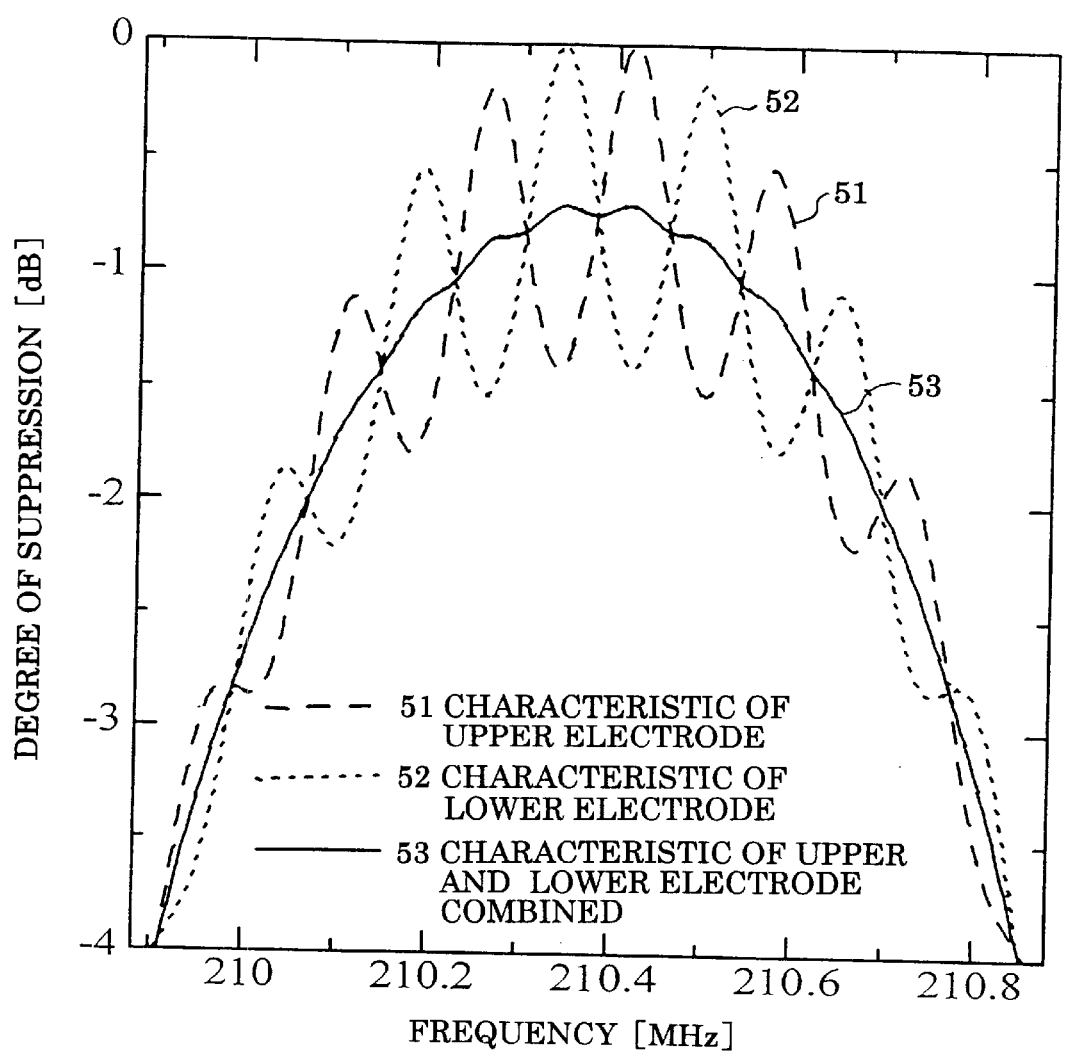
FIG. 9 is a graph showing a frequency characteristic of the SAW filter of Example 1.

FIG. 9 is a graph showing the frequency characteristic of the SAW filter of Example 1. In FIG. 9, a reference numeral 51 denotes the frequency characteristic of the upper exciting electrode 13 alone, a reference numeral 52 denotes the frequency characteristic of the lower exciting electrode 14 alone, and a reference numeral 53 denotes the frequency characteristic of the exciting electrodes 13 and 14 combined.

The frequency characteristic denoted by the reference numeral 53 in the figure shows that its ripple is 0.1 dB or smaller. Compared with the graphs of FIGS. 3(*a*) and 3(*b*), the ripple is decrease greatly to about one-fifteenth of that of the prior-art filter in Example 1 of the present invention.

EXAMPLE 2

Figure 5:
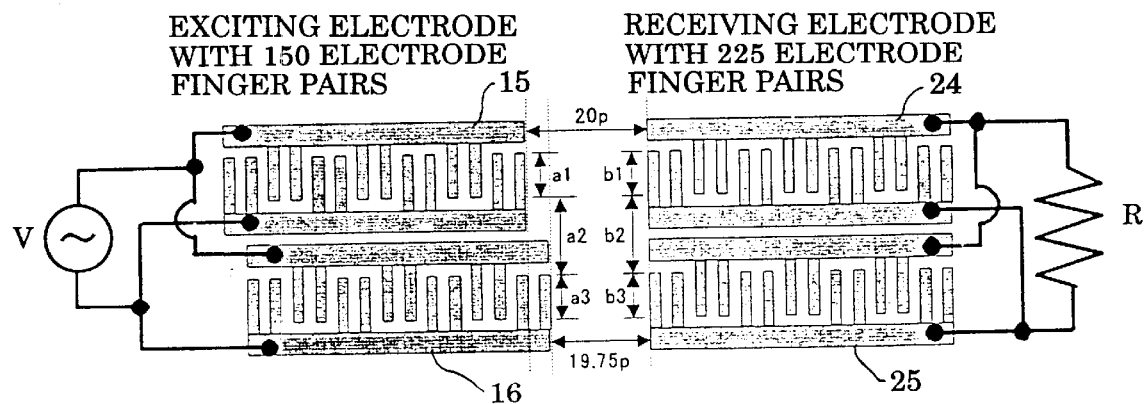
FIG. 5 illustrates the construction of an SAW filter according to Example 2 of the present invention.

FIG. 5 illustrates the construction of an SAW filter according to Example 2 of the present invention.

Example 2 has a characteristic in that the exciting electrode and the receiving electrode are each divided into two electrodes 15 and 16, and 24 and 25, respectively, and the two exciting electrodes are arranged in positions offset to each other by p/4 in the SAW propagation direction.

As in FIG. 4, the exciting electrodes 15 and 16 preferably have almost the same surface area for regions occupied by their respective interdigital electrodes on the piezoelectric substrate. Bus bar portions positioned on the upper and lower sides of the two exciting electrode 15 and 16 are connected to an AC power source V as shown in FIG. 5, while bus bar portions of the receiving electrodes 24 and 25 are connected to a resistance R.

In FIG. 5, the distance between the edges of the exciting electrode 15 and the receiving electrode 24 is 20p, and the distance between the edges of the exciting electrode 16 and the receiving electrode 25 is 19.75p. The difference is p/4 (=0.25p).

The number of electrode finger pairs of each of the exciting electrodes 15 and 16 is 150, the number of electrode finger pairs of each of the receiving electrodes 24 and 25 is 225, an upper aperture length a1 of the exciting electrode 15 is 30p, a lower aperture length a3 of the exciting electrode 16 is 30p, a length a2 of a connection part of the two electrodes 15 and 16 is 20p, an upper aperture length b1 of the receiving electrode 24 is 30p, a lower aperture length b3 of the receiving electrode 25 is 30p, and a length b2 of a connection part of the two electrodes 24 and 25 is 20p.

Also in the case of Example 2, it was confirmed that a frequency characteristic with a suppressed ripple was obtained.

EXAMPLE 3

Figure 6:
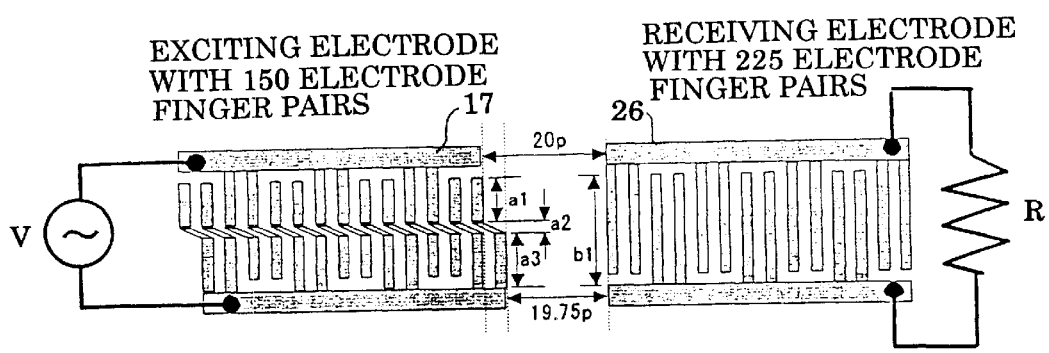
FIG. 6 illustrates the construction of an SAW filter according to Example 3 of the present invention.

FIG. 6 illustrates the construction of an SAW filter according to Example 3 of the present invention.

Example 3 is characteristic in that the electrode fingers of an exciting electrode 17 are bent almost in the middle such that they are shifted by p/4 in the SAW propagation direction.

In the exciting electrode 17, it is preferable that the area occupied by upper portions of the electrode fingers than bent portions in the middle is almost equal to the area occupied by lower portions of the electrode fingers than the bent portions. Ends of the upper portions and the lower portions of the electrode fingers are connected by connection electrode fingers in a central part a2 of the exciting electrode 17.

Bus bar portions on the upper and lower sides of the exciting electrode 17 are connected to an AC power source V, while bus bar portions on the upper and lower sides of the receiving electrode 26 are connected to a resistance R, as shown in FIG. 6.

In FIG. 6, the distance between an edge of an upper bus bar of the exciting electrode 17 and an edge of the receiving electrode 26 is 20p, and the distance between an edge of a lower bus bar of the exciting electrode 17 and an edge of the receiving electrode 26 is 19.75p. The difference is p/4 (=0.25p).

The number of electrode finger pairs of the exciting electrode 17 is 150, the number of electrode finger pairs of the receiving electrode 26 is 225, an aperture length a1 of the upper portion of the exciting electrode 17 is 35p, an aperture length a3 of the lower portion of the exciting electrode 17 is 35p, the length a2 of electrode fingers in the connection part between the upper portion and the lower portion is 10p, and an aperture length b1 of the receiving electrode 26 is 80 p.

Also in Example 3, a frequency characteristic with a suppressed ripple was obtained as in FIG. 9.

EXAMPLE 4

Figure 7:
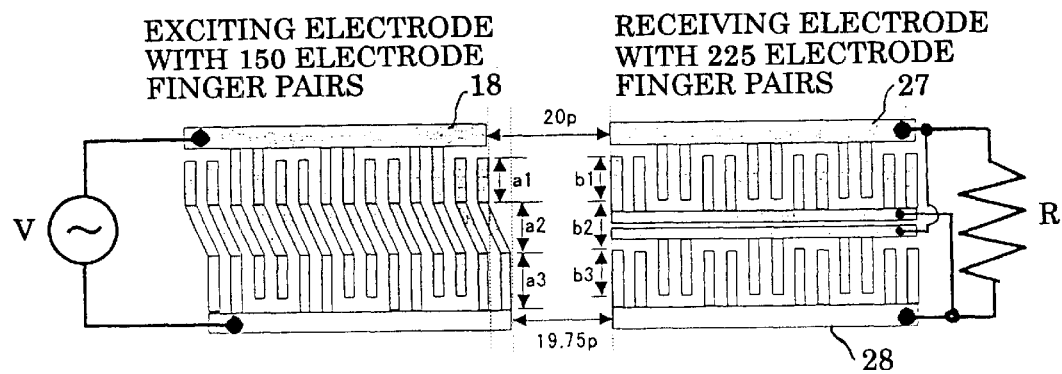
FIG. 7 illustrates the construction of an SAW filter according to Example 4 of the present invention.

FIG. 7 illustrates the construction of an SAW filter according to Example 4 of the present invention.

Example 4 is characteristic in that the electrode fingers of an exciting electrode 18 are formed to be bent at two bending points, and upper portions of the electrode fingers and lower portions of the electrode fingers are shifted from each other by p/4 in the SAW propagation direction.

It is preferable for suppressing the tertiary echo that the surface area of a region on the piezoelectric substrate occupied by the upper portions of the electrode fingers of the exciting electrode 18 is almost the same as the surface area of a region on the piezoelectric substrate occupied by the lower portions of the electrode fingers of the exciting electrode 18.

Bus bar portions on the upper and lower sides of the exciting electrode 18 are connected to an AC power source V as shown in FIG. 7, and bus bar portions of receiving electrodes 27, 28 are connected to a resistance, R.

In Example 4, electrode fingers in the upper portion a1 of the exciting electrode 18 and electrode fingers in the lower portion a3 of the exciting electrode 18 are shifted from each other by p/4 in the SAW propagation direction. Electrode fingers in the central portion a2 of the exciting electrode 18 are connection electrode fingers physically connecting the electrode fingers in the portions a1 and a3 to each other.

As shown in FIG. 7, in this Example 4, the receiving electrode is composed of two receiving electrodes 27 and 28 as corresponds to the two portions a1 and a3 of the exciting electrode 18 whose phases are shifted from each other.

In FIG. 7, the distance between an edge of an upper bus bar of the exciting electrode 18 and an edge of the receiving electrode 27 is 20p, and the distance between an edge of an lower bus bar of the exciting electrode 18 and an edge of the receiving electrode 28 is 19.75p. The difference is p/4 (=0.25p).

The number of electrode finger pairs of the exciting electrode 18 is 150, the number of electrode finger pairs of each of the receiving electrodes 27 and 28 is 225, an aperture length a1 of the upper portion of the exciting electrode 18 is 35p, an aperture length a3 of the lower portion of the exciting electrode 18 is 35p, the length a2 of the connection portion of the exciting electrode is 10p, an aperture length b1 of the receiving electrode 27 is 35p, an aperture length b3 of the receiving electrode 28 is 35p, and the length b2 of the connection portion is 10p.

Also in Example 4, a frequency characteristic with a suppressed ripple was obtained as in FIG. 9. From Example 1 to Example 4, the positional offset is implemented only with the exciting electrodes, but it may be implemented only with the receiving electrodes instead of the exciting electrodes.

EXAMPLE 5

Figure 8:
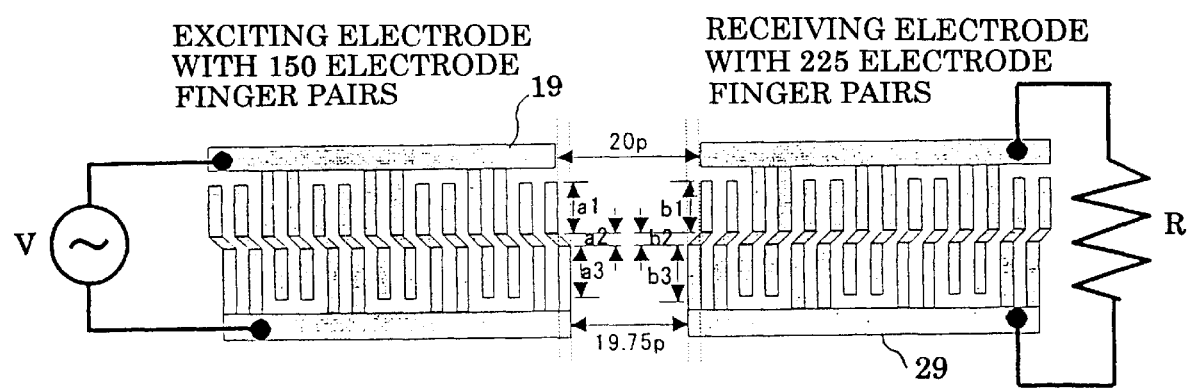
FIG. 8 illustrates the construction of an SAW filter according to Example 5 of the present invention.

FIG. 8 illustrates the construction of an SAW filter according to Example 5 of the present invention. In Example 5, the electrode fingers of both the exciting electrode 19 and the receiving electrode 29 are shifted in position as the exciting electrode 17 of FIG. 6.

The distance between an upper bus bar of the exciting electrode 19 and an upper bus bar of the receiving electrode 29 is 20p, and the distance between an lower bus bar of the exciting electrode 19 and a lower bus bar of the receiving electrode 29 is 19.75p.

An upper aperture length a1 of the exciting electrode 19 is 35p, a lower aperture length a3 of the exciting electrode 19 is 35p, the length a2 of the connection portion is 10p, an upper aperture length b1 of the receiving electrode 29 is 35p, a lower aperture length b3 of the receiving electrode 29 is 35p, and the length b2 of a connection portion is 10p.

With this construction, because the SAW excited by upper portions of electrode fingers and the SAW excited by lower portions of the electrode fingers have a phase shift of p/4, a frequency characteristic similar to that of FIG. 9 is also obtained in Example 5.

According to the present invention, it is possible to realize a SAW filter with a suppressed ripple which might otherwise be caused by the TTE, by shifting one region occupying about half the surface area of either one of the exciting electrode or the receiving electrode relatively to another region having half the surface area, by one quarter of the electrode period in the SAW propagation direction.

What is claimed is:

1. A surface acoustic wave filter comprising:

a piezoelectric substrate;

an exciting electrode formed on the piezoelectric substrate and exciting a surface acoustic wave; and a receiving electrode receiving the surface acoustic wave, wherein both the exciting and receiving electrodes are provided with interdigital electrode fingers having a period p, wherein one of the exciting and receiving electrodes is constructed of a plurality of interdigital electrode sub-units having substantially the same electrode surface areas occupied by interdigital electrode fingers, and wherein said plurality of interdigital electrode sub-units are disposed in a direction perpendicular to a propagation direction of the excited surface acoustic wave and have a positional relation such that the interdigital electrode sub-units are offset from each other by $(n\pm\frac{1}{4})$ p, wherein n is an integer, in a direction parallel to the propagation direction of the surface acoustic wave.

2. A surface acoustic wave filter according to claim 1, wherein the electrode of the exciting and receiving electrodes other than that constructed of said plurality of interdigital electrode sub-units is formed as a plurality of separate electrodes.

3. A surface acoustic wave filter, comprising:

a piezoelectric substrate;

an exciting electrode formed on the piezoelectric substrate and exciting a surface acoustic wave; and a receiving electrode receiving the surface acoustic wave, wherein both the exciting and receiving electrodes are provided with interdigital electrode fingers having a period of p, the interdigital electrode fingers of either one of the exciting and receiving electrodes are each constructed to have a bend at a center for provided a shift of $(n\pm\frac{1}{4})$p, wherein n is an integer, in a direction parallel to a propagation direction of the surface acoustic wave, and the interdigital electrode fingers of the other one of the exciting and receiving electrodes extend without bending in a direction perpendicular to the propagation direction of the surface acoustic wave.

4. A surface acoustic wave filter comprising:

a piezoelectric substrate;

an exciting electrode formed on the piezoelectric substrate and exciting a surface acoustic wave; and a receiving electrode receiving the surface acoustic wave, wherein both the exciting and receiving electrodes are provided with interdigital electrode fingers having a period of p, the interdigital electrode fingers of either one of the exciting and receiving electrodes are each constructed to have a bend at a center for providing a shift of $(n\pm\frac{1}{4})$p, wherein n is an integer, in a direction parallel to a propagation direction of the surface acoustic wave, the interdigital electrode fingers of the other one of the exciting and receiving electrodes extend without bending in a direction perpendicular to the propagation direction of the surface acoustic wave, and said other one of the exciting and receiving electrodes is composed of a plurality of interdigital electrode sub-units having substantially the same electrode surface areas occupied by the interdigital electrode fingers, the interdigital electrode sub-units being arranged in the direction perpendicular to the propagation direction of the surface acoustic wave.

5. A surface acoustic wave filter comprising:

a piezoelectric substrate;

an exciting electrode formed on the piezoelectric substrate and exciting a surface acoustic wave; and a receiving electrode receiving the surface acoustic wave, wherein both the exciting and receiving electrodes are provided with interdigital electrode fingers having a period of p, and the interdigital electrode fingers of the exciting and receiving electrodes are constructed to have a bend at a center and are offset by $(n\pm\frac{1}{4})p$, wherein n is an integer, in a direction parallel to a propagation direction of the surface acoustic wave.

* * * * *